United States Patent [19]

Lennen

[11] Patent Number: 4,614,528
[45] Date of Patent: Sep. 30, 1986

[54] DRY AIR BREATHER ASSEMBLY

[75] Inventor: James W. Lennen, Willow Grove, Pa.

[73] Assignee: System Development Corp., Camarillo, Calif.

[21] Appl. No.: 747,878

[22] Filed: Jun. 24, 1985

[51] Int. Cl.⁴ .............................................. B01D 53/04
[52] U.S. Cl. ........................................ 55/387; 55/493
[58] Field of Search ............... 34/79, 82, 192; 55/384, 55/385 R, 387, 493, 494

[56] References Cited

U.S. PATENT DOCUMENTS

| | | | |
|---|---|---|---|
| 1,675,228 | 6/1928 | Schmidt | 55/387 X |
| 2,544,733 | 3/1951 | Shuler | 55/387 |
| 3,067,560 | 12/1962 | Parker | 55/387 X |
| 3,271,089 | 9/1966 | Krellen | 55/387 X |
| 3,593,498 | 7/1971 | Semon | 55/387 X |
| 3,739,558 | 6/1973 | Hurson | 55/387 |
| 3,853,475 | 12/1974 | Gordon et al. | 55/387 |

Primary Examiner—Robert Spitzer
Attorney, Agent, or Firm—Francis A. Varallo; Mervyn L. Young; Kevin R. Peterson

[57] ABSTRACT

The present disclosure describes a dry air breather assembly adapted to be readily mountable over the breather ports of devices which are intolerant of intake air having high relative humidities in excess of a predetermined level. Such devices include the Winchester Hard Disk Unit in which the deposition of excess moisture on the read/write heads and magnetic disk media is particularly detrimental. The present assembly includes a unique elongated, low-profile enclosure for the efficient and effective use of a desiccant having a high moisture removal capability at relative humidities above the predetermined level, and low moisture removal capability, below the level.

8 Claims, 6 Drawing Figures

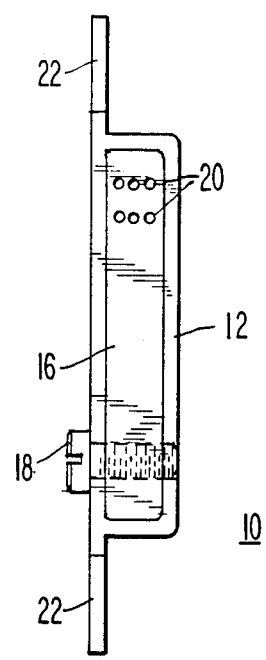
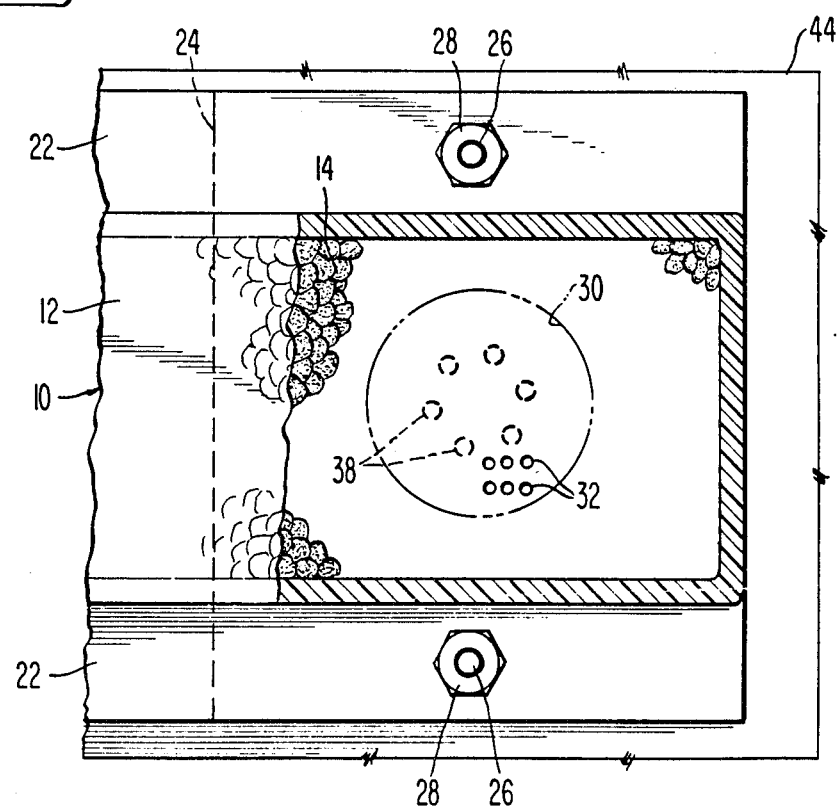

DRY AIR BREATHER ASSEMBLY

BACKGROUND OF THE INVENTION

Certain precision equipments, such as the electromechanical Winchester Hard Disk Unit (HDU), are not hermetically sealed and must be provided with breather ports to equalize internal and external (ambient) pressures. Without the equalization of pressures, air leaks may occur through various component seals. Such leaks would permit dust to enter the HDU, thereby causing possible electrical and mechanical malfunctions.

Pressure differentials commonly result from changes in temperature and altitude. As to the former, when an HDU is cold and placed in a warm, ambient environment, internal air is expelled through the breather ports as the unit reaches operating temperature. This condition poses little or no operational problems. However, when a warm HDU is placed in a cold environment, as the unit cools down, ambient air is drawn into the unit through its breather ports. This is the condition which exists when a unit operating at its maximum temperature is turned off and allowed to cool in a cold environment. If it is assumed that the HDU has been operating in high relative humidity greater than its design limit of 80%, then during cool down, moisture enters the unit through the ports and coats the read/write heads and magnetic disk media which are in a "park" position. In this case, the heads and disk media tend to stick to each other inhibiting the restart of the unit. Actually, many attempts at starting may be required before the bond between heads and media is broken. Adverse side effects from the last mentioned procedure are common ——the media surface may be damaged and the media particles which have been broken free in the start attempts constitute a source of further damage to the unit.

Several factors complicate the elimination of the foregoing moisture problem in the HDU. Normally, HDU's are mounted in very compact module enclosures, which preclude the use of bellows over the breather ports ——the bellows would have permitted internal air to expand and contract without causing the unit to ingest any of the ambient air. Also, the HDU transmits heat to its surrounding air through its housing. Therefore, its exterior surfaces must be free of structures which might impede such heat transfer and additionally, might restrict the free movement of heat-removing air surrounding the unit as provided with the module enclosure. Finally, since the HDU assembly is generally an off-the-shelf, finished product, no auxiliary electrical power terminals or mounting holes are available in the HDU housing to accept a dry air breather device. Therefore the mounting of such a device on the unit is a major consideration.

What is desired is a low-profile, small static type device that doesn't require electrical power and can readily be mounted on, and subsequently removed for service from, the HDU external housing. Such considerations obviate the use of mechanical type devices which require electrical power or high velocity vapor in order to remove water by impaction or centrifugal force. The present invention meets the above-mentioned requirements in an air breather assembly comprised of a unique enclosure, readily mountable on the HDU housing, and providing for the efficient and effective use of a specific type of desiccant disposed in the enclosure.

SUMMARY OF THE INVENTION

In accordance with the present invention there is provided an air breather assembly which is readily mountable on the HDU and is capable of removing excess water from the vapor entering the unit. An actual operative embodiment of the assembly is comprised of an elongated, generally rectangular, low-profile enclosure for retaining an appropriate desiccant. One extremity of the enclosure is closed by a removable breather plug which permits the filling of the enclosure with desiccant, the subsequent removal thereof for possible regeneration, and the refilling of the enclosure with new and/or regenerated desiccant. The plug includes at one end thereof, a plurality of small diameter, relatively long vapor/desiccant ports oriented parallel to the longitudinal axis of the enclosure. The design of the last mentioned ports restricts the diffusion process by which the desiccant removes moisture. It provides that substantially only that moisture will be removed from vapor entering the enclosure via the vapor/desiccant ports, which results from a pressure differential between the interior of the HDU and the ambient air. Otherwise, the desiccant would become saturated as a consequence of the HDU being in a high humidity atmosphere without encountering any temperature or pressure changes.

Diagonally opposite to the vapor/desiccant ports and situated adjacent the other closed extremity of the enclosure are a plurality of desiccant/HDU ports. The enclosure is mounted on the HDU such that the last mentioned ports overlie the HDU breather ports. The diagonal orientation of the vapor/desiccant ports and the desiccant/HDU ports provides a maximum length path to which the moist input air is exposed, thereby making the most effective use of the relatively short desiccant bed mandated by space constraints.

The desiccant material used in the dry air breather assembly must have certain properties needed for the present application. In an actual operative embodiment of the assembly, silica gel Grade 59, manufactured by the Davison Chemical Division of W. R. Grace and Company was found to have such properties. For example, while most commercially available desiccant products have an effective range commencing at 40% relative humidity, the Grade 59silica gel has high adsorbability at high humidities above 80% and low adsorbability at lower humidities. Moreover, the Grade 59 silica gel does not decrepitate or fracture when in contact with water droplets, and exhibits a small pellet size, making it ideal for maximum packing density in a small enclosure. Other features of Grade 59 silica gel are its chemical inertness, dimensional stability, non-toxicity, physical crush strength and its regenerative capability after saturation.

Installation of the breather assembly on the HDU by way of a mounting plate is accomplished in a routine manner as an additional assembly line task. Subsequent removal of the enclosure for servicing is readily performed.

Other features and advantages of the dry air breather assembly of the present invention will be apparent from the detailed description of the invention which follows.

BRIEF DESCRIPTION OF THE DRAWING

FIG. 3 is an end view of the breather assembly illustrating the removable plug at one end of the enclosure and the vapor/desiccant ports disposed in the plug.

FIG. 6 is an enlarged view of the mounted assembly, partially cut away to show the relationship of the respective pluralities of HDU breather ports to the breather assembly desiccant/HDU ports.

DESCRIPTION OF THE PREFERRED EMBODIMENT

Figure 1:
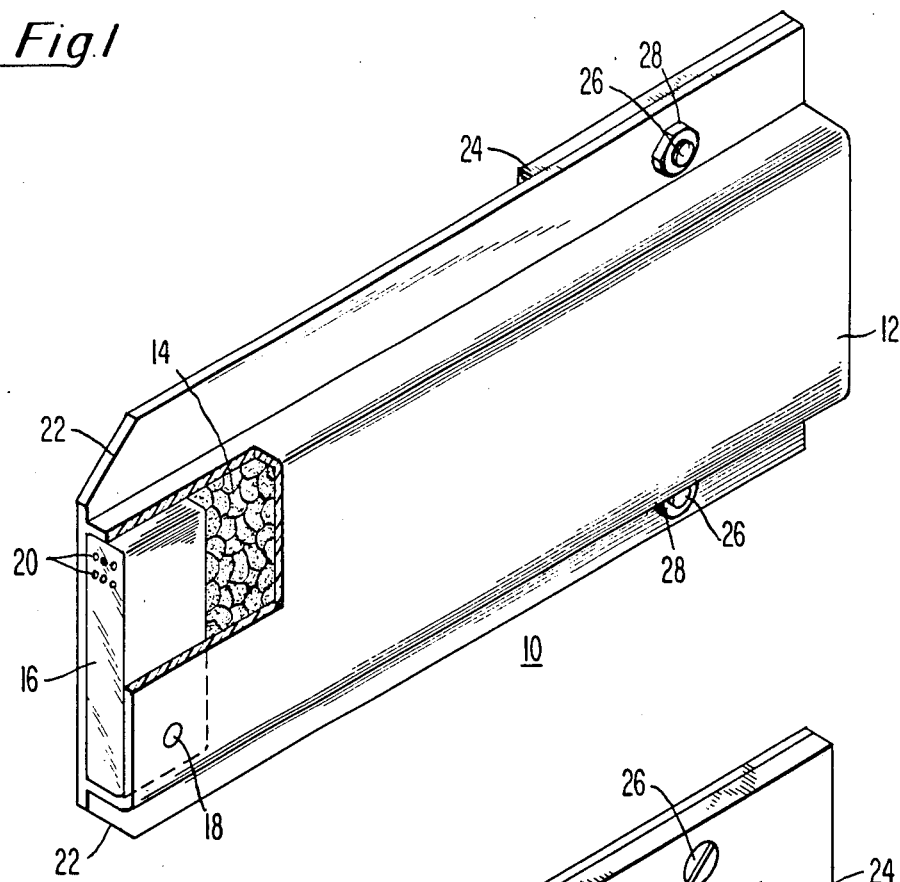
FIG. 1 is a pictorial view of the breather assembly of the present invention, with a portion of the enclosure cut away to illustrate the silica gel pellets.

The air breather assembly 10 of the present invention is depicted in FIG. 1. As seen in this figure, the assembly 10 is comprised of an elongated, generally rectangular box-like enclosure 12 for holding desiccant pellets 14. As noted hereinbefore, the pellets used in actual operative embodiments of the invention are Davison Grade 59 silica gel. It should be understood that the present invention is not limited to the use of this specific silica gel, but may employ other desiccants having substantially similar properties.

One extremity of enclosure 12 is closed by a removable breather plug 16. The plug 16 permits the filling of the enclosure 12 with the desiccant pellets 14, and is retained in position by a lock screw 18. A plurality of small diameter, long vapor/desiccant ports 20, as seen enlarged in FIG. 3, are formed in plug 16.

Figure 2:
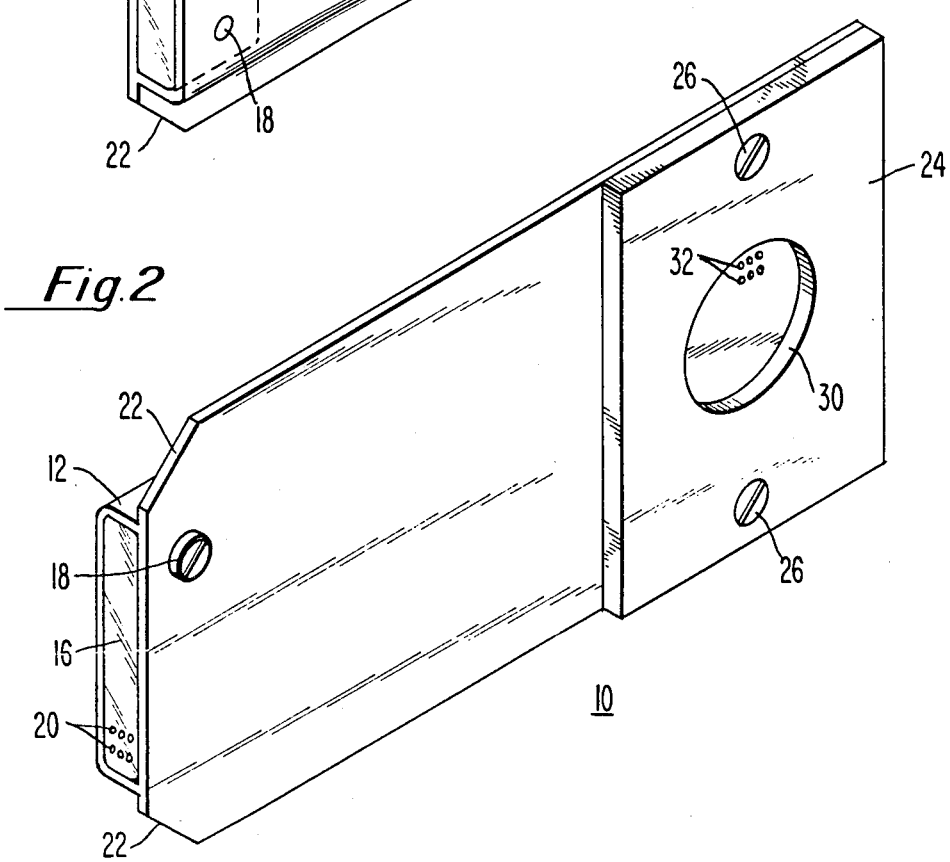
FIG. 2 is a pictorial view of the underside of the breather assembly which is installed adjacent the HDU housing.

Two opposed flange-like sections 22, coplanar with one side of enclosure 12, are provided. As also seen in FIG. 2, the flanges 22 permit the attachment of a mounting plate 24 by way of screws 26 and nuts 28 to the desiccant enclosure 12. Plate 24 includes a central opening 30. As will be described hereinafter in connection with FIGS. 4-6 inclusive, the plate 24 is used during the installation of the breather assembly 10. The enclosure 12 also includes at its other extremity, a plurality of desiccant/HDU ports 32 visible through opening 30 in plate 24 of FIG. 2. The vapor/desiccant ports 20 in plug 16 are diagonally opposite the desiccant/HDU ports 32 of enclosure 12.

Figure 4:
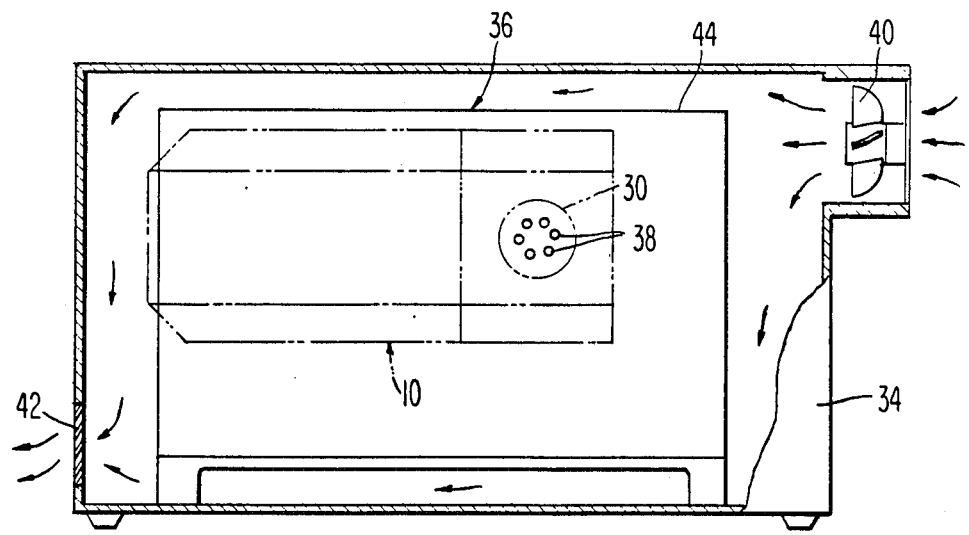
FIG. 4 illustrates the working environment of the HDU via its disposition in an electronic module and depicting the HDU breather ports, and the location of the breather assembly relative to the HDU housing.

In FIG. 4, there is illustrated in simplified form an electronic module 34 which includes an HDU 36 having a plurality of breather ports 38. The module 34, which generally includes other electronic components (not shown), provides for the circulation of air within its structure by bringing in outside air with a fan 40 and expelling it through louvers 42. The breather assembly 10 is shown in phantom to illustrate its intended location on the HDU housing 44.

Figure 5:
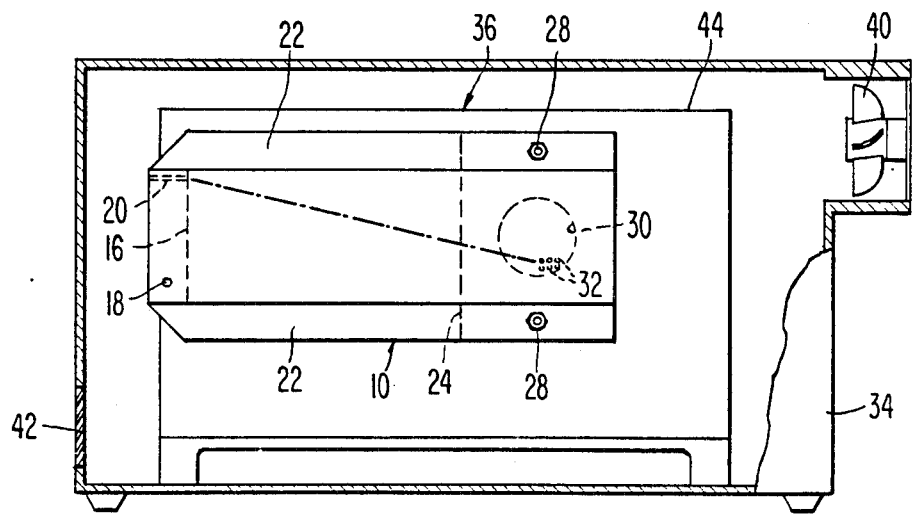
FIG. 5 illustrates the breather assembly of the present invention mounted on the HDU housing.

FIG. 5 illustrates the air breather assembly 10 installed on the HDU housing 44. This is accomplished by bonding the mounting plate 24 to the HDU housing 44 with a thermally conductive, electrically insulating epoxy adhesive (not shown). As seen in the enlarged view of FIG. 6, the opening 30 in mounting plate 24 is centered over the HDU breather ports 38. No manufacturing process is required for this type of mounting ——merely, an additional production line task.

The desiccant pellets 14 may be easily removed for regeneration by removing the dry air breather assembly 10 from the HDU housing 44. This is accomplished by removing the hex nuts 28, thereby releasing the enclosure 12 from mounting plate 14 which remains affixed to the HDU housing 44. The breather plug lock screw 18 is then removed and the plug 16, withdrawn from the enclosure 12. The expired pellets 14 are then emptied and may be processed for regeneration. Finally, active pellets 14 are again poured into the enclosure 12, the plug 16 reinserted and locked into place, and the enclosure 12 reattached to the mounting plate 14.

It is believed helpful to review the design of the air breather assembly to emphasize the criteria which were met to make efficient and effective use of the desiccant. One requirement is that the desiccant pellets 14 must only remove moisture when a pressure differential occurs between the HDU housing and the surrounding ambient. This criteria is met by three design features. First, the vapor/desiccant ports 20, FIG. 1 and FIG. 3, have a high, approximately 16:1, length to diameter ratio which greatly restricts the diffusion process by which the silica gel desiccant pellets 14 adsorb moisture. Second, the desiccant pellets 14 are of a size to create a dense pack within enclosure 12 which requires a pressure differential for vapor flow to occur. The dense packing with no appreciable voids also serves to eliminate the tendency of any incoming low velocity vapors to follow an open non-desiccant path from the vapor/desiccant ports 20 to the desiccant/HDU ports 32. Third, the configuration of the breather assembly 10 is such that the vapor/desiccant ports 20 draw vapors only from the most suitable location in module 34. Thus, the last mentioned ports 20 are situated out of the high velocity air stream created by fan 40, and are actually, at a static point in the air stream. Accordingly, the air drawn into module 34 has had maximum opportunity to deposit its moisture on the inner surfaces of the module and on the components situated therein.

A second requirement of the present assembly is that the enclosure 12 must make maximum use of the relatively short desiccant path necessitated by the limited space available. This requirement is met by arranging the vapor/desiccant ports 20 and the desiccant/HDU ports 32 at diagonally opposite extremities of enclosure 12, thus maximizing the length of the vapor path.

In the operative embodiment referred to hereinbefore, the enclosure 12 and associated flanges 22 were formed of Plexiglass; the plug 16, of plastic; and the mounting plate 24, of metal. Such materials have been designated solely for purposes of example and are not to be regarded as limiting the invention to their use. Moreover, while the present breather assembly 10 has been described as having particular application with Winchester Hard Disk Units, it should be apparent that the invention may be used with other electrical or mechanical devices, wherein the presence of high humidity air is undesirable or detrimental.

In conclusion, there has been described a costeffective, efficient, easily installed and maintained air breather assembly. As noted hereinbefore, the inventive concepts and implementation are directed to a specific application. In other applications, changes and modifications of the assembly may be needed to suit particular requirements. Such variations as are within the skill of the designer, and which do not depart from the true scope and spirit of the invention are intended to be covered by the following claims.

What is claimed is:

1. A dry air breather assembly for restricting the intake, through breather ports in a device, of ambient vapor having a high relative humidity which exceeds a predetermined level comprising:
- an elongated box-like enclosure having respective corresponding opposite open and closed extremities,
- a desiccant having high moisture removal properties at levels above said predetermined level and low moisture removal properties below said level, said desiccant being disposed within said enclosure,
- a breather plug situated within the open extremity of said enclosure, said breather plug having a plurality of vapor/desiccant ports formed therein and oriented parallel to the longitudinal axis of said enclosure,
- a plurality of desiccant/device ports formed in said enclosure adjacent the closed extremity thereof and oriented transverse to the longitudinal axis of said enclosure,
- means for mounting said enclosure on said device, said desiccant/device ports being positioned adjacent said breather ports whereby a vapor path is provided therebetween, and
- whereby said ambient vapor entering said enclosure via said vapor/desiccant ports in response to pressure differentials is dried by said desiccant and enters said breather ports at a relative humidity level which does not exceed said predetermined level.

2. A dry air breather assembly as defined in claim 1 characterized in that said vapor/desiccant ports are positioned adjacent one end of said breather plug, said respective pluralities of vapor/desiccant ports and desiccant/device ports being diagonally displaced with respect to each other, thereby maximizing the length of vapor path through said desiccant.

3. A dry air breather assembly as defined in claim 2 further characterized in that the length of each of said vapor/desiccant ports in said breather plug is substantially greater than the diameter thereof, thereby restricting the diffusion process by which said desiccant removes moisture from said ambient vapor.

4. A dry air breather assembly as defined in claim 3 wherein said means for mounting said enclosure on said device includes a pair of opposed flange-like sections coplanar with the surface of said enclosure which lies adjacent said housing,
- a mounting plate having one of its planar surfaces removably affixed to said flange-like sections, said mounting plate having a central opening for accommodating both said breather ports of said device and said desiccant/device ports of said enclosure, the other of said planar surfaces of said mounting plate being permanently affixed to said device.

5. A dry air breather assembly as defined in claim 4 wherein said desiccant is a granular buffer grade silica gel, the particle size of said silica gel being small enough to permit a dense packing of said enclosure, thereby precluding the presence of non-desiccant vapor paths within said enclosure.

6. A dry air breather assembly as defined in claim 5 wherein said silica gel provides maximum moisture adsorption in the 80% to 100% relative humidity range, said predetermined level of ambient relative humidity being 80%.

7. A dry air breather as defined in claim 6 wherein the length to diameter ratio of each of said vapor/desiccant ports is 16:1.

8. A dry air breather assembly as defined in claim 7 wherein said enclosure has a low-profile, rectangular cross section.

* * * * *